United States Patent
Guo et al.

(10) Patent No.: US 7,081,288 B2
(45) Date of Patent: Jul. 25, 2006

(54) TAMPER-EVIDENT, HEAT RESISTANT CAST LABEL STOCK

(75) Inventors: Liping Guo, Milwaukee, WI (US); Scott H. Kogler, Whitefish Bay, WI (US)

(73) Assignee: Brady Worldwide, Inc., Milwaukee, WI (US)

( * ) Notice: Subject to any disclaimer, the term of this patent is extended or adjusted under 35 U.S.C. 154(b) by 137 days.

(21) Appl. No.: 10/626,013

(22) Filed: Jul. 24, 2003

(65) Prior Publication Data
US 2005/0019519 A1    Jan. 27, 2005

(51) Int. Cl.
*B32B 9/00* (2006.01)
(52) U.S. Cl. .................. 428/40.2; 428/40.1; 428/40.9; 428/41.3; 428/41.5; 428/220; 428/353; 428/354; 428/922
(58) Field of Classification Search ............... 428/40.1, 428/40.2, 40.9, 41.3, 41.5, 220, 353, 354, 428/355, 922
See application file for complete search history.

(56) References Cited

U.S. PATENT DOCUMENTS

| | | | |
|---|---|---|---|
| 4,664,859 A | 5/1987 | Knoop | 264/102 |
| 4,863,772 A | 9/1989 | Cross | 428/40 |
| 4,880,703 A | 11/1989 | Sakamoto et al. | 428/378 |
| 5,232,775 A | 8/1993 | Chamberlain et al. | 428/323 |
| 5,284,705 A | 2/1994 | Cahill | 428/328 |
| 5,409,968 A | 4/1995 | Clatanoff et al. | 523/204 |
| 5,441,809 A | 8/1995 | Akhter | 428/354 |
| 5,536,158 A | 7/1996 | Dresie et al. | 425/75 |
| 5,553,835 A | 9/1996 | Dresie et al. | 264/204 |
| 5,776,373 A | 7/1998 | Bergmann et al. | 252/518.1 |
| 5,798,060 A | 8/1998 | Brevett | 252/520.1 |
| 5,868,959 A * | 2/1999 | Mayo et al. | 252/62.54 |
| 5,916,652 A | 6/1999 | Miner et al. | 428/41.8 |
| 5,958,537 A | 9/1999 | Akhter | 428/40.2 |

FOREIGN PATENT DOCUMENTS

| EP | 1179577 A1 | 2/2002 |
|---|---|---|
| JP | 6083267 | 3/1994 |

* cited by examiner

*Primary Examiner*—Nasser Ahmad
(74) *Attorney, Agent, or Firm*—Whyte Hirschboeck Dudek SC

(57) ABSTRACT

A heat resistant label stock comprised of an unsupported cast face sheet layer, an adhesive layer and a release liner characterized by a face sheet, an adhesive layer and a release liner. The label stock is generally tamper-evident in that removal destroys or damages the label. In certain embodiments the label stock is electrostatic dissipative.

30 Claims, 1 Drawing Sheet

Heat resistant tamper-evident label stock construction

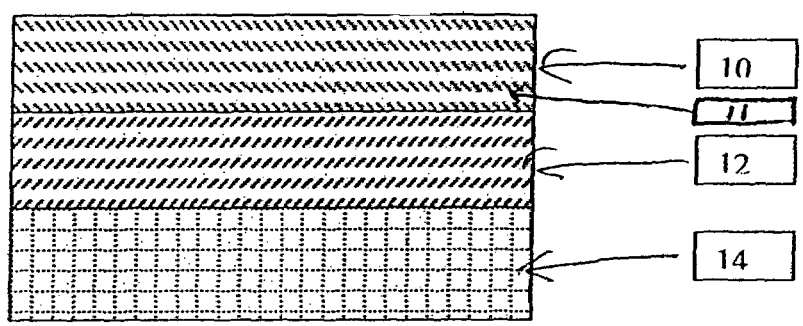
Figure 1. Heat resistant tamper-evident label stock construction
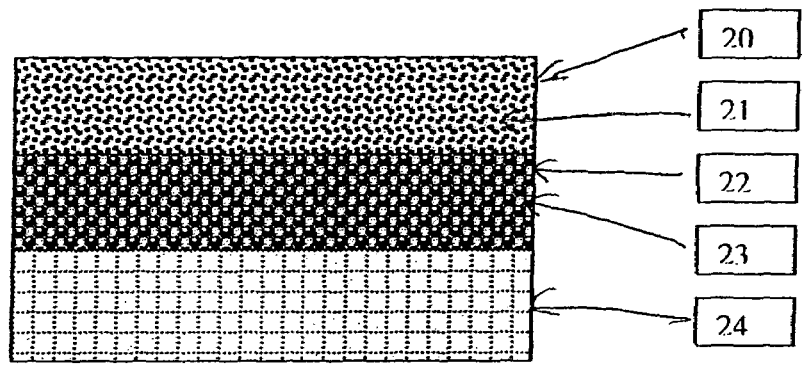
Figure 2. Electrostatic dissipative, tamper-evident label stock construction

TAMPER-EVIDENT, HEAT RESISTANT CAST LABEL STOCK

BACKGROUND OF THE INVENTION

This invention relates to labels, more particularly, the invention relates to laminated labels comprising a cast face sheet layer and a pressure-sensitive adhesive layer. In one aspect, the invention relates to tamper-evident labels. In another aspect, the invention relates to labels suitable for high temperature applications such as those found in printed circuit board processing and automotive industries, while, in a further aspect, the invention relates to labels designed to dissipate static electricity that may be harmful to electronic components or clean rooms.

Labels for electronic components preferably meet a number of requirements. For example, the labels should not damage the electronic components with static electricity, should be able to withstand the heat and chemicals used in processing the electronic components and should be tamper-evident to prevent counterfeiting of the components.

Static dissipation is important for electronic components which are vulnerable to damage from very low voltage (e.g. 50 V) discharges. For example, computer board assemblies contain many static sensitive integrated circuit chips which bear barcode labels that are used for tracking and identification of the boards. These labels are potential sources of static electricity.

Static electricity is generated during application and removal of a label by a phenomenon known as triboelectric charging. Whenever two surfaces in close proximity are displaced, a charge imbalance is generated on each of the surfaces. On electrically insulative surfaces these charges are not dissipated and could build to an eventual rapid discharge (which can appear as a spark). These discharges can destroy the gate oxide layers inside of an integrated circuit chip, thus rendering it useless. Even low voltage discharges which do not generate a visible spark can destroy a modern integrated circuit.

Many current labels used on electronic components are not electrostatic dissipative labels. Many actions on the labels, such as printing on the top of the labels, separating the labels from the liner, application of the labels to a substrate, removal or repositioning of the labels on a substrate, or even the processes in which the labels are manufactured, can generate electrostatic charges on the label, liner and any surface it has been in contact with. These charges may be dissipated and damage the electronic circuitry on which the labels are placed and/or exceed the limits for static safety at work stations where circuit boards are assembled.

Current labels that are used on electronic components are typically four layers: top coat, face sheet, pressure-sensitive adhesive and release liner. The facesheet or backing layer material for high heat resistivity is usually expensive, such as polyethylene naphthalate (PEN) and polyimide face sheets. Most of the materials from which the label is built are generally electrically insulative in nature. Static electricity is generated at the time the label is peeled from the liner before application to the electronic part, and these charges can exceed hundreds of volts. During the peeling and placement operations, a danger exists that these charges will rapidly discharge and damage the circuitry in the vicinity at which the label is applied. The repositioning or removal of the label is another triboelectric charging event that also carries the danger of damage from rapid discharge. To reduce damage caused by electrostatic discharge, ANSI/ESD S20.20 page 7 is an industry specification that indicates a proposed maximum work surface potential of 200 Volts and use of packaging materials having surface resistivity greater than $10^5$ ohms/square and less than $10^{12}$ ohms/square.

In addition, label stocks with the above construction can be removed and reused by counterfeiters. Label removal and switching is becoming a bigger problem. For brand name protection, reduction of fraudulent warranty claims and product liability reasons manufacturers are looking for ways to identify their own products and indicate that their product is not out of warranty. In some embodiments of this invention the label stock is made tamper-evident due to damage and destruction of the label that would result from attempted removal.

Labels for electronic circuit application may also be required to resist elevated temperatures from the soldering or solder reflow operation. For surface mount soldering the reflow temperature can be 180° C. to 220° C., while for through-hole soldering, a temperature exposure of about 300° C. is typical. In the future as lead is being replaced in solder alloys even higher temperatures may be required.

A current heat resistant label stock, 3M ScotchMark™ 3921 with an acrylic based cast face sheet, does not provide enough tamper-evident property on certain substrates and the label stock turns to yellow or brown at a relatively low temperature. Lintec™ heat resistant label stock HR2240-50 with an acrylic face sheet as well, does not provide good solvent resistance, and therefore is unsuitable for use in the printed wiring assembly processes that include a number of different cleaning procedures with harsh cleaners.

Some current labels with electrostatic dissipative properties, Brady B-477, Brady B-473, Brady B-478, and Brady B-479 are described in U.S. Pat. No. 5,958,537. The labels of U.S. Pat. No. 5,958,537 are comprised of a polyester or polyimide face sheet coated with an electrostatic dissipative primer layer, which in turn is laminated to an electrostatic dissipative pressure-sensitive adhesive layer. The primer layer and adhesive layer contain electrically conductive particles, e.g. metals. However, these electrostatic dissipative labels still have the potential to generate static electric charges, attract dust on the topside of labels and the liners which labels are carried on, and dissipate the charges to electronic components or printed circuit boards because the face sheet, top coat and liners are not static safe materials.

Therefore, the industry still needs a fully electrostatic dissipative label that has heat and solvent resistant properties and may also be tamper-evident.

SUMMARY OF THE INVENTION

The inventive label is characterized by the use of a printable, cast face sheet.

Exemplary features of the invention can include tamper-evidence, heat resistance, solvent resistance, and/or electrostatic dissipation.

In one preferred embodiment, the invention is a label consisting essentially of: (A) a cast face sheet having opposing first and second surfaces, the first surface of the cast face sheet layer adapted to carry printed information, the cast face sheet layer comprising a phenoxy or polyester binder resin matrix; (B) a pressure-sensitive adhesive layer having opposing first and second surfaces, the first surface of the adhesive layer in intimate and binding contact with the second surface of the cast face sheet; and, (C) a release liner in contact with the second surface of the adhesive layer.

In another preferred embodiment, the invention is a completely electrostatic dissipative label consisting essentially of: (A) a cast face sheet having opposing first and second surfaces, the first surface of the cast face sheet adapted to carry printed information, the cast face sheet layer comprising a phenoxy or polyester binder resin matrix containing first electrically conductive particles; (B) a pressure-sensitive adhesive layer containing second electrically conductive particles, having opposing first and second surfaces, the first surface of the adhesive layer in intimate and binding contact with the second surface of the cast face sheet; and, (C) a static dissipative release liner in contact with the second surface of the adhesive layer.

In a further preferred embodiment, the invention is a label consisting of either of the above embodiments whereby the fracturability or low toughness (tensile and elongation properties) of the face sheet, combined with sufficient adhesive strength in the pressure-sensitive adhesive layer, results in a tamper-evident construction.

BRIEF DESCRIPTION OF THE DRAWINGS

FIG. 1 is a schematic depiction of a cross-section of one embodiment of a label tape of this invention.

FIG. 2 is a schematic depiction of a cross-section of an electrostatic dissipative embodiment of a label tape of this invention.

DETAILED DESCRIPTION OF THE INVENTION

The present invention is a label stock consisting of a printable cast pigmented polymeric face sheet, a pressure-sensitive adhesive and a release liner. The label stock provides very good heat and solvent resistant properties, especially resistant to the cleaning fluids used in the printed wiring board assembly industry. In one preferred embodiment it provides a tamper-evident function. In another preferred embodiment it also provides complete electrostatic dissipative properties.

The high heat resistant tamper-evident label stock (see FIG. 1) consists of a thermal transfer printable, pigmented cast face sheet layer 10, pigment particles 11, a pressure-sensitive adhesive layer 12; and a release liner 14.

The electrostatic dissipative heat resistant tamper-evident label stock (see FIG. 2) consists of a thermal transfer printable cast face sheet layer 20, first electrically conductive particles 21, pressure-sensitive adhesive layer 22, second electrically conductive particles 23, and an electrostatic dissipative release liner 24.

The cast face sheet layer 10 or 20 is composed of a binder resin composition, pigment particles 11 or 21 at a loading sufficient to give the face sheet frangible properties for tamper evidence and, optionally, dispersed electrically conductive particles 21 at a loading sufficient to render the face sheet electrostatic dissipative. The binder resin composition is such that it can withstand elevated temperatures of solder reflow, (e.g. temperatures in excess of 200° C.) without significant softening, oozing, or visible distortion. The binder resin also has a good affinity for pigment particles and first conductive particles such that the particles remain well dispersed within the resin over the life of the label. Moreover, the binder resin should exhibit good resistance to the chemicals to which the label may be exposed during the processes in which the electronic component is made or used.

Phenoxy and polyester resins are the preferred binder resins used in the practice of this invention. Preferred phenoxy resins are the linear copolymers made from bisphenol A and epichlorohydrin and which are available from Phenoxy Associates under the brand Phenoxy™ PKHH. Preferred polyester resins are those available from Bostik under the brand Vitel®, e.g., Vitel® 2100. The many grades of both of these types of resins can be used in the practice of this invention, as well as blends of them.

Additional components of the composition can include one or more of: white or colored pigments typically used in coatings, such as $TiO_2$, $BaSO_4$, $CaCO_3$, silica, iron oxide, zinc oxides or clays; surfactants; curing agents that can react with polyols; catalysts; and other coating additives. The ratios of the pigment and the resin can range from about 5/100 to about 300/100 by weight.

The cast face sheet layer can be made by casting the coating onto a casting liner by a common coating method such as reverse roll, gravure, or slot die. Face sheet casting is well-known in the art as described in U.S. Pat. No. 4,664,859, incorporated herein by reference. The thickness of the cast face sheet can typically be from about 0.02 mm to about 0.1 mm.

For embodiments where the label is an electrostatic dissipative label, the cast face sheet layer comprises a resin matrix in combination with electrically conductive particles and other fillers and an adhesive layer in combination with electrically conductive particles. The electrostatic dissipative cast face sheet layer can be made from compositions incorporating metal or conductive particles, a conductive polymer based coating or other static dissipative coating with a surface resistivity between $10^6$ to $10^9$ ohms/square.

The electrically conductive particles which are dispersed within the binder resin or adhesive are preferably one or more of the following: (i) metal or metal-coated particles, (ii) carbon or graphite particles, (iii) conductive metal oxide particles, (iv) inorganic oxide particles with an electrically conductive shell (commonly known as core-shell electro-conductive pigments), and (v) conductive polymers in either particle or mixture form (the latter usually achieved when the conductive polymer is miscible in the binder resin). These particles are further described in U.S. Pat. No. 5,441,809 which is incorporated herein by reference, and they are used in sufficient amounts such that particle-to-particle proximity throughout the binder resin renders the resulting combination (i.e. binder with dispersed conductive particles) static dissipative.

Many metal or metal-coated particles are available for use in this invention. Metal particles include those in which one or more of these other metals or metal oxides are coated on a core particle such as carbon, graphite, polymer or glass spheres, another metal, metal oxide, or mineral. The conductive particle for use in a particular binder resin and label application is chosen based on a number of factors including cost, loading requirements, mechanical properties, thermal properties, and the amount of electrical resistivity imparted to the cast face sheet layer.

Preferred conductive particles are the core-shell particles in which a nonconductive core (usually an oxide or mineral particle) carries a thin outer shell of a conductive material. Examples include antimony-doped tin oxide particles from Ishihara Sangyo Kaisha, LTD with a needle shape, allowing a relatively low loading to get the desired electrical properties. ISK FT 3000 is the preferred conductive particle.

A completely electrostatic dissipative label stock (see FIG. 2) contains a thermal transfer printable, electrostatic dissipative cast face sheet layer 20, an electrostatic dissipative pressure-sensitive adhesive layer 22, and an electrostatic dissipative liner 24.

Typically the ratios of the conductive particles and the resin range from about 5/100 to about 100/100 by weight and the surface resistivity of the cast face sheet layer ranges from about $10^6$ ohms/square to about $10^9$ ohms/square.

The cast face sheet layer for the electrostatic dissipative label can be made by casting the top coat onto a casting liner. The thickness of the cast face sheet can be from about 0.005 mm to about 0.2 mm, is more preferably from about 0.02 mm to about 0.1 mm, and is most preferably from about 0.025 mm to about 0.06 mm.

The adhesive layer is a combination of a pressure-sensitive adhesive and a low-loading (e.g. typically less than about 9, preferably less than about 6 and more preferably less than about 3, weight percent based on the combined weight of the pressure-sensitive adhesive and the particles) of conductive particles. The adhesive layer can be those included in U.S. Pat. No. 5,958,537. The adhesive can be either direct or transfer coated on the topside of the cast face sheet layer. The surface resistivity ranges from about $10^6$ to about $10^{12}$ ohms/square after coating and drying. Any conducting particles, including those described with respect to the top coat layer, which are of sufficient effectiveness so that electrical resistivity through the layer is established in the range of about $10^6$ to about $10^{12}$ ohm cm can be used in the practice of this invention. Metallic conductive particles, e.g. nickel as available from Novamet Co. under the brand Novamet™ 525, are the preferred conductive particles because only a very low loading, e.g. about 2 weight percent, is required to obtain the desired electrical resistivity.

A feature of an embodiment of the current inventive label is the absence of a separate, supporting face sheet. Prior art labels used separate face sheets comprising polymers such as polyester, polyethylene napthalate and polyimide. Such support or backing face sheets may either be clear or have a low level of pigmentation. In either case, these separate face sheets have mechanical properties such as toughness and tensile strength, and high chemical resistance. In comparison, the cast face sheet formed from the binder resin with high pigment loading loses the mechanical toughness characteristics in some degree, resulting in a more frangible face sheet.

Permanently affixing, pressure-sensitive adhesives are the preferred adhesives for use in the tamper-evident embodiments of this invention. Acrylic and rubber-based pressure-sensitive adhesives are representative of the various types of adhesives that can be used in this invention but for reasons of temperature stability and high shear strength, the acrylic-based adhesives are preferred. Gelva™ 1753 from Solutia, Inc. and Polytac™ 303T from H & N Chemicals are preferred acrylic-based permanent (i.e. nonremovable) pressure-sensitive adhesives. Other examples of permanent adhesives are Gelva™ 2887 from Solutia, Inc. and Aroset™ 1085 from Ashland Company.

The thickness of the pressure-sensitive adhesive layer is typically at least about 0.01 mm, preferably at least about 0.02 mm, and more preferably at least about 0.025 mm and it typically does not exceed about 0.075 mm, preferably it does not exceed about 0.06 mm and more preferably it does not exceed about 0.05 mm.

Conductive particles are dispersed into the electrostatic dissipative cast face sheet coating and the pressure-sensitive adhesive in any convenient manner to obtain a relatively homogeneous dispersion. The electrostatic dissipative cast face sheet layer is then cast onto a releasable casting liner by a convenient method (e.g. slot die, reverse roll, or gravure). Once the face sheet is cast, the pressure-sensitive adhesive is applied to the exposed side of the cast face sheet, again in any convenient manner (e.g. slot die, reverse roll, or gravure). Another releasable liner is laminated to the pressure-sensitive adhesive to protect it during storage and facilitate further processing and handling. The releasable casting liner is then removed from the cast face sheet layer and the resultant label stock (carried on the pressure-sensitive adhesive liner) is slit and die cut into finished labels by conventional processing. The labels can be imprinted with the desired tracking and/or identifying information at any convenient time, e.g. prior to or during use. For use, the labels are simply removed from the release liner and applied to a component either by hand or by machine.

The release liner for the pressure-sensitive adhesive can be any paper or polymeric release liner. Typically, release liners have a release coating, such as silicone release coating to facilitate removal of the adhesive label from the liner. For embodiments where the label is an electrostatic dissipative label, the liner is also preferably an electrostatic dissipative liner.

Such an electrostatic dissipative liner can comprise a static dissipative silicone release coating on the release side of the liner and on the other side of the liner, another electrostatic dissipative coating. The electrostatic dissipative liner coatings are usually made with a conductive polymer to make both sides static dissipative. Such an electrostatic dissipative liner is commercially available as BR-167 from Brady Worldwide, Inc.

Another trait of some embodiments of the current inventive labels is that they are tamper-evident. The cast face sheet is fragile and tends to break into small pieces when attempts are made to peel the label off of a substrate to which the pressure-sensitive adhesive has been affixed. Furthermore, although the labels may be removed from a substrate by soaking in very harsh solvents, such treatment will cause the cast face sheet to either swell or shrink and cause the adhesive to either dissolve or to ooze from the label. As such, even if soaked off, the labels will be destroyed.

The following examples illustrate specific embodiments of this invention. Unless otherwise noted, all parts and percentages are by weight.

EXAMPLE 1

Sample labels were prepared from the cast face sheet composition shown below for Example 1. A cast face sheet coating solution is made by dissolving the phenoxy resin in a suitable solvent, e.g. 1, 3-dioxolane, at room temperature and slowly adding the pigment while the solution is agitated with a Cowles™ blade high shear mixer. The cast face sheet is slot die coated from this solution onto a releasable casting liner and dried and cured to form a face sheet. A pressure-sensitive adhesive coating (see Example 1 Pressure-sensitive Adhesive Composition) is applied by slot die coating. The adhesive is applied to the dried cast face sheet (still carried on its releasable casting liner) and is passed through drying ovens after which a silicone release liner is laminated to it. The releasable casting liner is removed and the adhesive coated face sheet is slit to the appropriate size and converted into small labels by rotary die cutting. 50.8 mm long×6.35 mm wide label samples of Example 1 were tested for solvent resistance, heat resistance, physical properties, and tamper-evident features.

Example 1: Cast Face Sheet Composition

| | |
|---|---|
| 25 parts | TiO$_2$ |
| 27 parts | Phenoxy Resin (Paphen ® PKHH) |
| 25 parts | 1,3 dioxolane |
| 0.5 parts | Mineral Spirits (Nuosperse ® 657) |
| 2 parts | Polyisocyanate (Desmodur N-75) |
| 100 parts | Pressure-sensitive Adhesive Composition Ashland 1085 |

Example 1 label samples were tested for solvent resistance in accordance with Testing Method MIL-STD-202F, Notice 12, Method 215J. The samples were printed with Brady Series R6000 thermal transfer ribbon using BradyPrinter™ Model 300X at a burn temperature of 28. The labels were printed with alphanumerics and 3:1 ratio barcodes with 0.006" ×dimension bars.

The label samples were subjected to 3 cycles of 3 minute immersions immediately followed by a toothbrush rub after each immersion. The results, shown in Table 1, illustrate that the inventive labels have good solvent resistance.

TABLE 1

Solvent Resistance Testing Results

| Test fluid | Example 1 |
|---|---|
| Solvent A | No visible effect |
| 1 part IPA, 3 parts Mineral Spirits | |
| Solvent C | No visible effect |
| Terpene Defluxer | |
| Solvent D | No visible effect |
| Saponifier at 70° C. | |

Printed label samples of Example 1 and a competing label sample were tested for heat resistivity as follows. Label samples were placed on in a thin aluminum panel for 20 minutes. Then the panels with the label samples were put into a preheated oven at the indicated temperatures for 5 minutes. The panels with the labels were removed from the oven and allowed to cool down at room temperature. Printed images were still legible in all cases. The results, shown in Table 2, illustrate that the inventive labels are not visibly affected by heat up to 280° C. and, while yellowing, are otherwise resistant to heat up to 320° C.

TABLE 2

Heat Resistance Testing Results

| Temperature | Example 1 | Competing Label |
|---|---|---|
| 220° C. | No visible effect | Slight Yellowing |
| 240° C. | No visible effect | Yellowing |
| 260° C. | No visible effect | Brown discoloration |
| 280° C. | No visible effect | Brown discoloration |
| 300° C. | Slight yellowing | Brown discoloration |
| 320° C. | Yellowing | Brown discoloration |

The physical properties of the label stock of Example 1 were measured (without the release liner). As reported in Table 3, the labels have very low values for elongation and tensile strength.

TABLE 3

Physical Properties

| Sample width | Thickness | Peak load | % Elongation | Elastic Modulus | Tensile Strength |
|---|---|---|---|---|---|
| 25.4 mm | 0.041 mm | 3.65 kg | 1.2% | 544,145 psi | 0.144 kg/mm |

*Test Method: ASTM D882-97 Standard Test Method for Tensile Properties of Thin Plastic Sheeting The labels of Example 1 were tested for tamper-evidency as follows. The labels were applied to panels with different surfaces and allowed to dwell for both 20 minutes and 24 hours. After the specified time, an attempt was made to manually peel them from each test surface. The test results, as shown in Table 4, demonstrate that the inventive labels cannot be removed intact from various surfaces.

TABLE 4

Manual peel test results.

| Surface | 20 minutes | 24 hours |
|---|---|---|
| Glass | label broke into small pieces | label broke into small pieces |
| Aluminum | label broke into small pieces | label broke into small pieces |
| FR4 Epoxy | label broke into small pieces | label broke into small pieces |
| Stainless Steel | label broke into small pieces | label broke into small pieces |
| Polypropylene | label broke into small pieces | label broke into small pieces |
| Textured ABS | label broke into small pieces | label broke into small pieces |

EXAMPLE 2

Sample labels were prepared from the cast face sheet composition shown below for Example 2. An electrostatic dissipative case face sheet coating is made by dissolving the phenoxy resin in 1,3-dioxolane, at room temperature and slowly adding the pigment and conductive TiO$_2$, while the solution is agitated with a Cowles™ blade high shear mixer. The cast face sheet is slot die coated from this solution onto a releasable casting liner and dried and cured to form a cast face sheet.

A pressure-sensitive adhesive coating (see Example 2 electrostatic dissipative Pressure-sensitive Adhesive Composition) is made by mixing the nickel particles into the pressure-sensitive acrylic psa and stirring until uniform. It is applied by slot die coating. The adhesive is applied to the face sheet formed by the dried cast face sheet (still carried on its releasable casting liner) and is passed through drying ovens after which an electrostatic dissipative silicone release liner paper (BR-167 from Brady Worldwide, Inc.) is laminated to it. The releasable casting liner is removed and the adhesive coated face sheet is slit to the appropriate size and converted into small labels by rotary die cutting. Samples of the Example 2 were tested for solvent resistance, heat resistance, electrical resistivity, physical properties and tamper-evident features.

Example 2: Electrostatic Dissipative Labels Cast Face Sheet Composition

| | |
|---|---|
| 10 parts | TiO$_2$ |
| 27 parts | Phenoxy Resin (Paphen ® PKHH) |
| 25 parts | 1,3-dioxolane |
| 0.5 parts | Mineral Spirits (Nuosperse ® 657) |
| 15 parts | Conductive TiO$_2$ (ISK FT 3000) |
| 2 parts | Polyisocyanate (Desmodur N-75) |
| | Electrostatic Dissipative Pressure-sensitive Adhesive Composition |
| 99 parts | Pressure-sensitive acrylic adhesive) Gelva ® 1753 |
| 1 part | Nickel Pigment (Novamet 525) |

The labels of Example 2 were tested for surface resistivity as a measure of static dissipation. Test method EOS/ESD S11.11 was used. The surface resistivity is measured by cutting a 4×4 inch sheet and placing the sheet with the side to be tested facing up on the dielectric plate of an Electro-Tech System Model 872A. Center the probe over the sample and place the probe firmly on the sample surface. Read the results after 60 seconds with the voltage set of 100 volts. The measured values are reported in Table 5.

The triboelectric voltage generated during the peeling of the label from the liner is measured by removing the release liner and placing the tested side of the label approximately one inch from the charge probe of a 3M 711 Charge Analyzer. Labels 50.8 mm long×6.35 mm wide were tested. The measurement is taken immediately. The electrostatic test results are reported in Table 5.

TABLE 5

Electrostatic dissipative Property Test Results

| Test | electrostatic dissipative Cast face sheet | electrostatic dissipative Adhesive | electrostatic dissipative liner release liner |
|---|---|---|---|
| Surface Resistivity (ohms/square @ 75° F., 20% R.H.) EOS/electrostatic dissipative S11.11 | 1.04 × 10$^8$ | 9.0 × 10$^8$ | 8.0 × 10$^7$ |
| Static Decay (seconds to 1% of initial charge) EIA-541 | Positive Charge 0.3 Negative Charge 0.2 | Positive Charge 0.3 Negative Charge 0.2 | Positive Charge 0.4 Negative Charge 0.4 |
| Triboelectric Charging (volts) | <10 after 10 finger rubs | 22.5 (after removing a label from the liner and immediately holding the label to a static sensing device) | −2.2 (after removing a label from the liner and immediately holding the liner to a static sensing device) |

Example 2 label samples were tested for solvent resistance in accordance with Testing Method MIL-STD-202F, Notice 12, Method 215J. The samples were printed with Brady Series R6000 thermal transfer ribbon using BradyPrinter™ Model 300X at a burn temperature of 28. The labels were printed with alphanumerics and 3:1 ratio barcodes with 0.006" xdimension bars.

The label samples were subjected to 3 cycles of 3 minute immersions immediately followed by a toothbrush rub after each immersion. The results, shown in Table 6, illustrate that the inventive labels have good solvent resistance.

TABLE 6

Solvent Resistance Testing Results

| Test Fluid | Example 1 |
|---|---|
| Solvent A 1 part IPA, 3 parts Mineral Spirits | No visible effect |
| Solvent C Terpene Defluxer | No visible effect |
| Solvent D Saponifier at 70° C. | No visible effect |

Printed label samples of Example 2 were tested for heat resistance as follows. Label samples were placed on a thin aluminum panel for 20 minutes. Then the panels with the label samples were put into a preheated oven at the indicated temperatures for 5 minutes. The panels with the labels were removed from the oven and allowed to cool down at room temperature. Printed images were legible in all samples. The results, shown in Table 7, illustrate that the inventive labels are not visibly affected by heat up to 280° C. and, while yellowing, are otherwise resistant to heat up to 320° C.

TABLE 7

Heat Resistance Testing Results

| Temperature | Example 1 |
|---|---|
| 220° C. | No visible effect |
| 240° C. | No visible effect |
| 260° C. | No visible effect |
| 280° C. | No visible effect |
| 300° C. | Slight yellowing |
| 320° C. | Yellowing |

The physical properties of the label samples of Example 2 were measured (without the release liner). As reported in Table 8, the labels have very low values for elongation and tensile strength.

TABLE 8

Physical Properties

| Sample width | Thickness | Peak load | % Elongation | Modulus | Tensile Strength |
|---|---|---|---|---|---|
| 25.4 mm | 0.0076 mm | 4.45 kg | 1.5% | 300,021 psi | 0.176 kg/mm |

*Test Method: ASTM D882-97

The labels of Example 2 were tested for tamper-evidency as follows. The labels were applied to panels with different surfaces and allowed to dwell for both 20 minutes and 24 hours. After the specified time, an attempt was made to manually peel them from each test surface. The test results, as shown in Table 9, demonstrate that the inventive labels cannot be removed intact from various surfaces commonly found in the electronics industry.

TABLE 9

Manual Peel Test Results.

| Surface | 20 minutes | 24 hours |
|---|---|---|
| Glass | Label broke into small pieces | Label broke into small pieces |

TABLE 9-continued

Manual Peel Test Results.

| Surface | 20 minutes | 24 hours |
|---|---|---|
| Aluminum | Label broke into small pieces | Label broke into small pieces |
| FR4 Epoxy | Label broke into small pieces | Label broke into small pieces |
| Stainless Steel | Label broke into small pieces | Label broke into small pieces |
| Polypropylene | Label broke into small pieces | Label broke into small pieces |
| Textured ABS | Label broke into small pieces | Label broke into small pieces |

Although the invention has been described in considerable detail through the preceding examples, this detail is for the purpose of illustration only. Many variations and modifications such as an electrically conductive, face sheet supported embodiment with no tamper evidence feature, can be made by one skilled in the art without departing from the spirit and scope of the invention as described in the appended claims.

What is claimed is:

1. A label stock consisting of:
   A. A cast face sheet layer having opposing first and second surfaces, the first surface of the cast face sheet layer adapted to carry printed information, the cast face sheet layer comprising a phenoxy, or modified phenoxy binder resin matrix;
   B. A pressure-sensitive adhesive layer having opposing first and second surfaces, the first surface of the adhesive layer in intimate and binding contact with the second surface of the cast face sheet layer; and,
   C. A release liner in contact with the second surface of the adhesive layer.

2. The label of claim 1 wherein the phenoxy binder resin is a modified or linear copolymer made from bisphenol A and epichlorohydrin.

3. The label of claim 1 wherein the phenoxy resin is crosslinked with an isocyanate or other hydroxyl functional crosslinker.

4. The label of claim 1 in which the cast face sheet layer is between about 0.005 mm and about 0.2 mm in thickness.

5. The label of claim 1 in which the pressure-sensitive adhesive is a permanent pressure-sensitive adhesive.

6. The label of claim 1 in which the pressure-sensitive adhesive layer is between about 0.01 mm and about 0.075 mm in thickness.

7. The label of claim 1 which is heat resistant for 5 minutes without discoloration up to a temperature of at least about 280° C.

8. The label of claim 1 which is resistant to printed wiring board processing cleaners and solvents.

9. The label of claim 1 which is tamper-evident such that the label, without the release liner, cannot be removed intact from a substrate upon which the second surface of the pressure-sensitive adhesive layer is in binding contact.

10. The label of claim 1 in which the cast face sheet layer comprises at least one pigment or filler.

11. The label of claim 10 in which the ratio of pigment or filler to resin ranges from about 5/100 to about 300/100 by weight.

12. The label of claim 10 in which the pigment or filler is $TiO_2$, $BaSO_4$, $CaCO_3$, silica, iron oxide, zinc oxide or clay.

13. An electrostatic dissipative label stock consisting of:
   A. A cast face sheet layer having opposing first and second surfaces, the first surface of the cast face sheet layer adapted to carry printed information, the cast face sheet layer comprising a phenoxy, or modified phenoxy binder resin matrix containing first electrically conductive particles;
   B. A pressure-sensitive adhesive layer containing second electrically conductive particles having opposing first and second surfaces, the first surface of the adhesive layer in intimate and binding contact with the second surface of the cast face sheet layer; and
   C. A release liner in contact with the second surface of the adhesive layer.

14. The label of claim 13 wherein the phenoxy resin is a modified or linear copolymer made from bisphenol A and epichlorohydrin.

15. The label of claim 13 wherein the phenoxy resin is crosslinked with an isocyanate or other hydroxyl functional crosslinker.

16. The label of claim 13 in which the electrically conductive particles comprise at least about 10 weight percent of the combined weight of the binder resin and conductive particles.

17. The label of claim 13 in which the first electrically conductive particles of the binder resin are inorganic oxide particles carrying an electrically conductive shell.

18. The label of claim 13 in which the cast face sheet layer is between about 0.005 mm and about 0.2 mm in thickness.

19. The label of claim 13 in which the pressure-sensitive adhesive is a permanent pressure-sensitive adhesive.

20. The label of claim 13 in which the second electrically conductive particles of the pressure-sensitive adhesive are metal particles.

21. The label of claim 13 in which the second electrically conductive particles of the pressure-sensitive adhesive are nickel.

22. The label of claim 13 in which the second electrically conductive particles comprise less than about 9 weight percent of the combined weight of the particles and adhesive.

23. The label of claim 13 in which the pressure-sensitive adhesive layer is between about 0.01 mm and about 0.075 mm in thickness.

24. The label of claim 13 in which the release liner is electrostatic dissipative.

25. The label of claim 13 which is heat resistant for 5 minutes without discoloration up to a temperature of at least about 280° C.

26. The label of claim 13 which is resistant to printed wiring board processing cleaners and solvents.

27. The label of claim 13 which is tamper-evident such that the label, without the release liner, cannot be removed intact from a substrate upon which the second surface of the pressure-sensitive adhesive layer is in binding contact.

28. The label of claim 13 in which the cast face sheet layer comprises at least one pigment or filler.

29. The label of claim 28 in which the ratio of pigment or filler to resin ranges from about 5/100 to about 300/100 by weight.

30. The label of claim 28 in which the pigment or filler is $TiO_2$, $BaSO_4$, or $CaCO_3$, silica, iron oxide, zinc oxide or clay.

* * * * *